United States Patent
Choi

(10) Patent No.: US 9,608,639 B2
(45) Date of Patent: Mar. 28, 2017

(54) SEMICONDUCTOR DEVICE

(71) Applicant: SK hynix Inc., Icheon-si, Gyeonggi-do (KR)

(72) Inventor: Hoon Choi, Yongin-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/798,854

(22) Filed: Jul. 14, 2015

(65) Prior Publication Data

US 2016/0013796 A1    Jan. 14, 2016

(30) Foreign Application Priority Data

Jul. 14, 2014   (KR) .......................... 10-2014-0088042

(51) Int. Cl.
| | | |
|---|---|---|
| *H03L 7/06* | (2006.01) | |
| *H03L 7/08* | (2006.01) | |
| *H03L 7/081* | (2006.01) | |
| *H03L 7/095* | (2006.01) | |

(52) U.S. Cl.
CPC .......... *H03L 7/0802* (2013.01); *H03L 7/0818* (2013.01); *H03L 7/095* (2013.01)

(58) Field of Classification Search
CPC .................................................. H03L 7/0802
See application file for complete search history.

(56) References Cited

U.S. PATENT DOCUMENTS

| | | | | |
|---|---|---|---|---|
| 2002/0101744 A1* | 8/2002 | DeMone | ................ | G04G 19/04 363/59 |
| 2004/0263226 A1* | 12/2004 | Kim | ...................... | H03L 7/0805 327/158 |
| 2010/0277152 A1* | 11/2010 | MacFarlane | ............ | H02M 3/07 323/288 |

FOREIGN PATENT DOCUMENTS

KR    1020080097097 A    11/2008

* cited by examiner

*Primary Examiner* — Daniel Puentes
(74) *Attorney, Agent, or Firm* — William Park & Associates LTD.

(57) ABSTRACT

A semiconductor device may include a delay line including a first group of unit delay cells and a second group of unit delay cells. The first group of unit delay cells and the second group of unit delay cells may be configured for delaying a phase of a clock by a unit cycle of a reference frequency. The reference frequency may serve as a reference for distinguishing between a first frequency and a second frequency. The semiconductor device may include a reservoir capacitor located adjacent to one or more of the unit delay cells of the first group. Only the first group of the unit delay cells may be used to delay the phase of the clock.

8 Claims, 7 Drawing Sheets

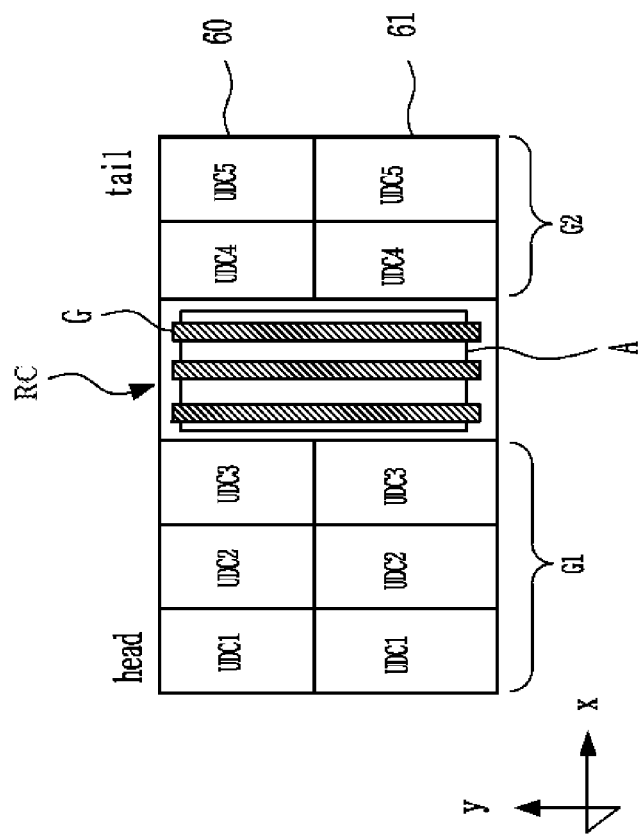

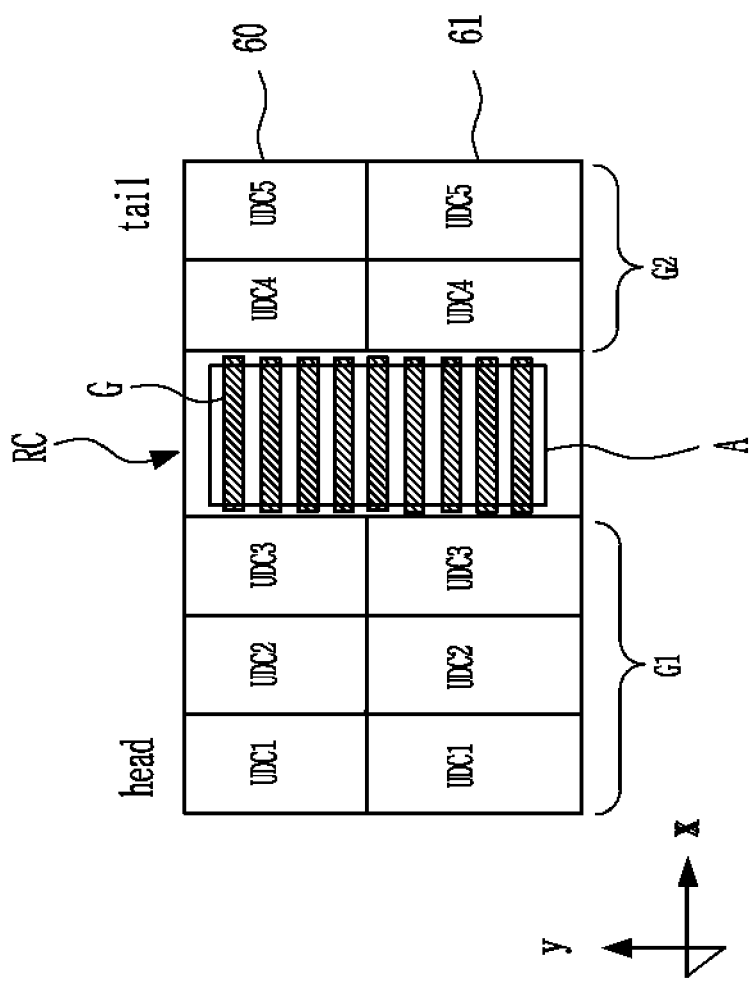

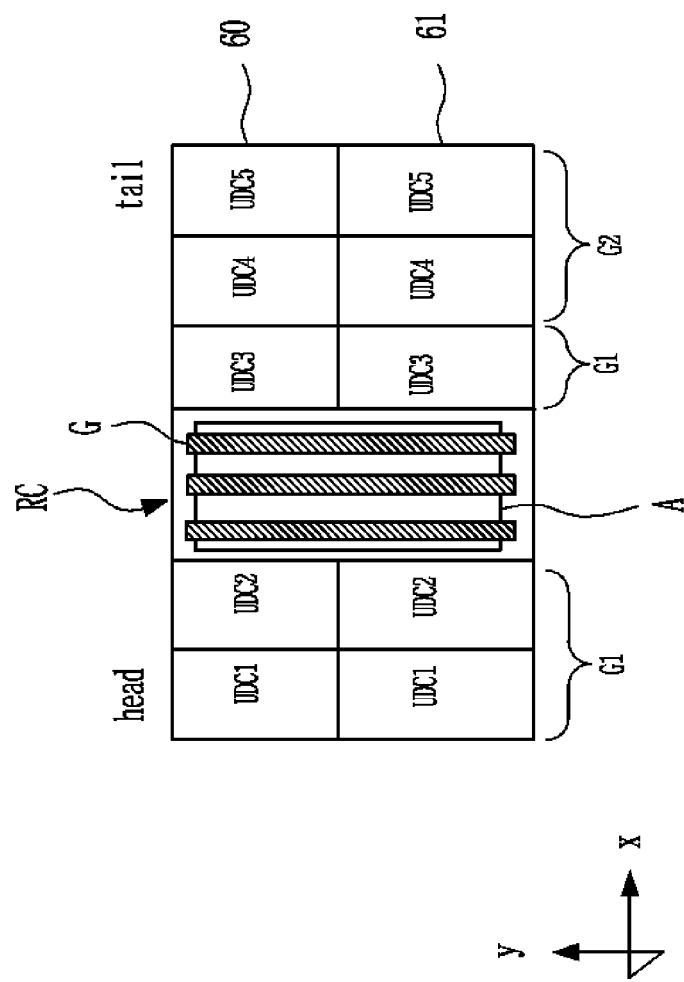

SEMICONDUCTOR DEVICE

CROSS-REFERENCES TO RELATED APPLICATION

The present application claims priority under 35 U.S.C. §119(a) to Korean Patent Application No. 10-2014-0088042, filed on Jul. 14, 2014, in the Korean Intellectual Property Office, which is incorporated herein by reference in its entirety.

BACKGROUND

1. Technical Field

Various embodiments generally relate to a semiconductor design technology, and more particularly, to a semiconductor device including a delay line.

2. Related Art

Recently, with the development of semiconductor-related technology, semiconductor integrated circuits have been gradually reduced in size, highly integrated, and improved in operating speed. Thus, noise is increased by parasitic capacitance, inductance, and resistance which occur in the semiconductor integrated circuits, and a design scheme for supplying stable power to the semiconductor integrated circuits is becoming an important issue.

SUMMARY

In an embodiment, a semiconductor device may be provided. The semiconductor device may include a delay line including a first group of unit delay cells and a second group of unit delay cells. The first group of unit delay cells and the second group of unit delay cells may be configured for delaying a phase of a clock by a unit cycle of a reference frequency. The reference frequency may serve as a reference for distinguishing between a first frequency and a second frequency. The semiconductor device may include a reservoir capacitor located adjacent to one or more of the unit delay cells of the first group. Only the first group of the unit delay cells may be used to delay the phase of the clock.

BRIEF DESCRIPTION OF THE DRAWINGS

FIG. 4 is a layout diagram of a semiconductor device in accordance with an embodiment.

FIG. 5 is a layout diagram of a semiconductor device in accordance with an embodiment.

FIG. 6 is a layout diagram of a semiconductor device in accordance with an embodiment.

DETAILED DESCRIPTION

Hereinafter, a semiconductor device will be described below with reference to the accompanying drawings through various examples of embodiments.

A synchronous semiconductor memory device such as DDR SRAM (Double Data Rate Synchronous DRAM) transmits data to an external device using an internal clock synchronized with an external clock inputted from the external device such as a memory controller. Thus, in order to stably transmit data between a memory and the memory controller, it is very important to synchronize the external clock applied to the memory from the memory controller with data outputted from the memory.

The data outputted from the memory may be outputted in synchronization with an internal clock. When the internal clock is first applied to the memory, the internal clock may be synchronized with the external clock. However, the phase of the internal clock may be delayed while the internal clock passes internal elements of the memory, for example, an input buffer, a control circuit, surrounding circuits, a cell array, a signal line and the like. When the internal clock is outputted to the outside of the memory, the internal clock may not be synchronized with the external clock. Thus, in order to stably transmit data outputted from the memory, the phase of the internal clock, which has been delayed while passing through the internal elements of the memory, needs to be reversely compensated for to be synchronized with the phase of the external clock. Examples of a clock synchronization circuit to perform such a role may include a delay locked loop (DLL) circuit.

Figure 1:
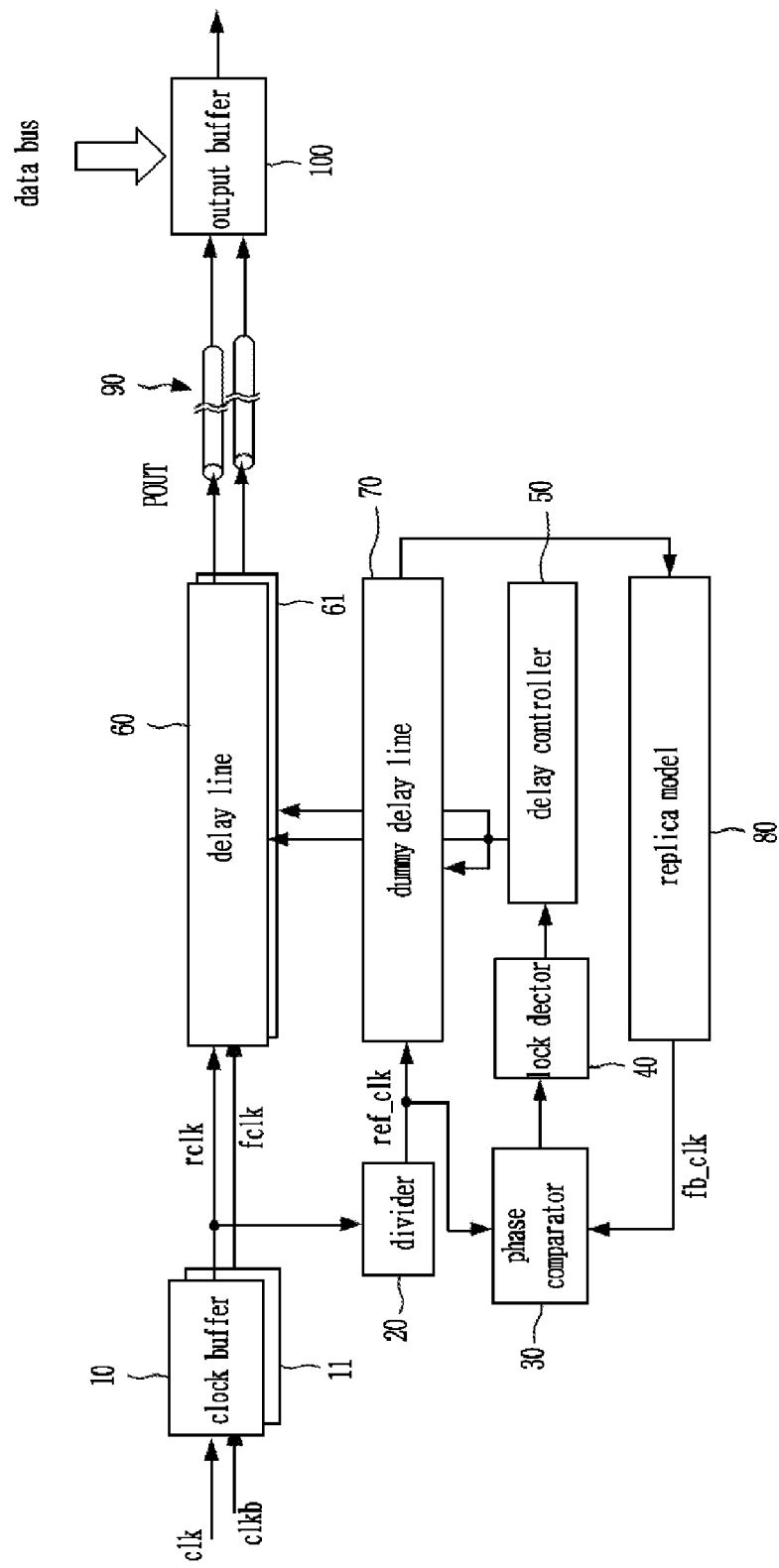
FIG. 1 is a block diagram illustrating an example of a register control-type DLL circuit related to an embodiment.

FIG. 1 is a block diagram of a register control-type DLL circuit related to an embodiment.

Referring to FIG. 1, the register control-type DLL circuit may include clock buffers 10 and 11, a divider 20, a phase comparator 30, a lock detector 40, a delay controller 50, delay lines 60 and 61, a dummy delay line 70, a replica model 80, a clock signal line 90, and an output buffer 100.

The clock buffers 10 and 11 may receive external clocks clk and clkb, and buffer the received clocks as internal rising/falling clocks rclk and fclk. In the case of a DLL used in DDR SRAM, the clock buffers 10 and 11 may include a rising edge clock buffer 10 and a falling edge clock buffer 11. The rising edge clock buffer 10 may generate a rising clock rclk when a source clock clk inputted from outside is synchronized with a rising edge, and the falling edge clock buffer 11 may generate a falling clock fclk when an inverted source clock clkb inputted from outside is synchronized with a falling edge.

The divider 20 may divide the rising clock rclk before the rising clock rclk is transmitted to the dummy delay line 70. The divider 20 may generate a reference clock ref_clk by dividing the frequency of the rising clock rclk by 1/N where N is a positive number ranging from 4 to 8. The main reason to divide the rising clock rclk is in order to reduce power consumption.

The phase comparator 30 may compare the reference clock ref_clk to the phase of a feedback clock fb_clk which is fed back from the replica model 80, and detect a phase difference between the reference clock ref_clk and feedback clock fb_clk. The phase comparator 30 may control the delay controller 50 based on the comparison result.

The lock detector 40 may receive the comparison result of the phase comparator 30, continuously compare the phases during a lock cycle of the DLL, and generate a flag signal indicating that lock has been completed, when the phases of the reference clock ref_clk and the feedback clock fb_clk coincide with each other at a desired timing.

The delay controller 50 may control the delay amounts of the delay lines 60 and 61 using a signal outputted from the phase comparator 30. The delay controller 50 may include logic for setting paths of the delay lines 60 and 61 and a bidirectional shift register for changing the positions of the paths. The shift register may receive four input signals and shift the received signals. According to the initial input condition, the shift register may have the initial Max/Min delay by holding both ends. The signals inputted to the shift register may include two shifting right signals and two shifting left signals. For the shifting operation, the signals may have a high-level period such that two signals do not overlap each other.

The delay lines 60 and 61 may delay the phases of the clocks rclk and fclk inputted from outside through the clock buffers 10 and 11. The delay lines 60 and 61 may include a first delay line 60 and a second delay line 61. The first delay line 60 may delay the phase of the rising clock rclk, and the second delay line 61 may delay the phase of the falling clock fclk. The first and second delay lines 60 and 61 may have substantially the same configuration. The phase delay degrees of the delay lines 60 and 61 may be set through the phase comparator 30, and a delay path for determining phase delay may be set according to the control of the delay controller 50. The delay lines 60 and 61 may include a plurality of unit delay cells each coupled to NAND gates. Each of the unit delay cells may have an input terminal coupled one-to-one to a shift register of the delay controller 50, and a path in which the value of an output terminal of a shift register becomes a high level may be determined as a path through which the clocks rclk and fclk having passed through the clock buffers 10 and 11 are inputted.

The dummy delay line 70 may delay the reference clock ref_clk and output the delayed clock to the replica model 80, in order to generate the feedback clock fb_clk inputted to the phase comparator 30. The dummy delay line 70 may have the same configuration as the delay lines 60 and 61. However, unlike the delay lines 60 and 61 for receiving the rising/falling clocks rclk and fclk which are not divided, the dummy delay line 70 may receive the reference clock ref_clk divided through the divider 20. Thus, the power consumption of the dummy delay line 70 may be reduced.

The replica model 80 may be configured by modeling delay elements which are arisen until external clocks of the chip are inputted and transmitted to the delay lines 60 and 61 and arisen until clocks outputted from the delay lines 60 and 61 are outputted to the outside of the chip. The replica model 80 may reflect a delay time based on the modeled delay elements into the clock outputted from the dummy delay line 70, in order to generate the feedback clock fb_clk.

The clock signal line 90 may include a path through which the output POUT of the delay lines 60 and 61 are transmitted to the output buffer 100.

The output buffer 100 may receive data from a memory core through a data bus, and output the data to a data output pad (not illustrated) in synchronization with a clock of the clock signal line 90.

Figure 2:
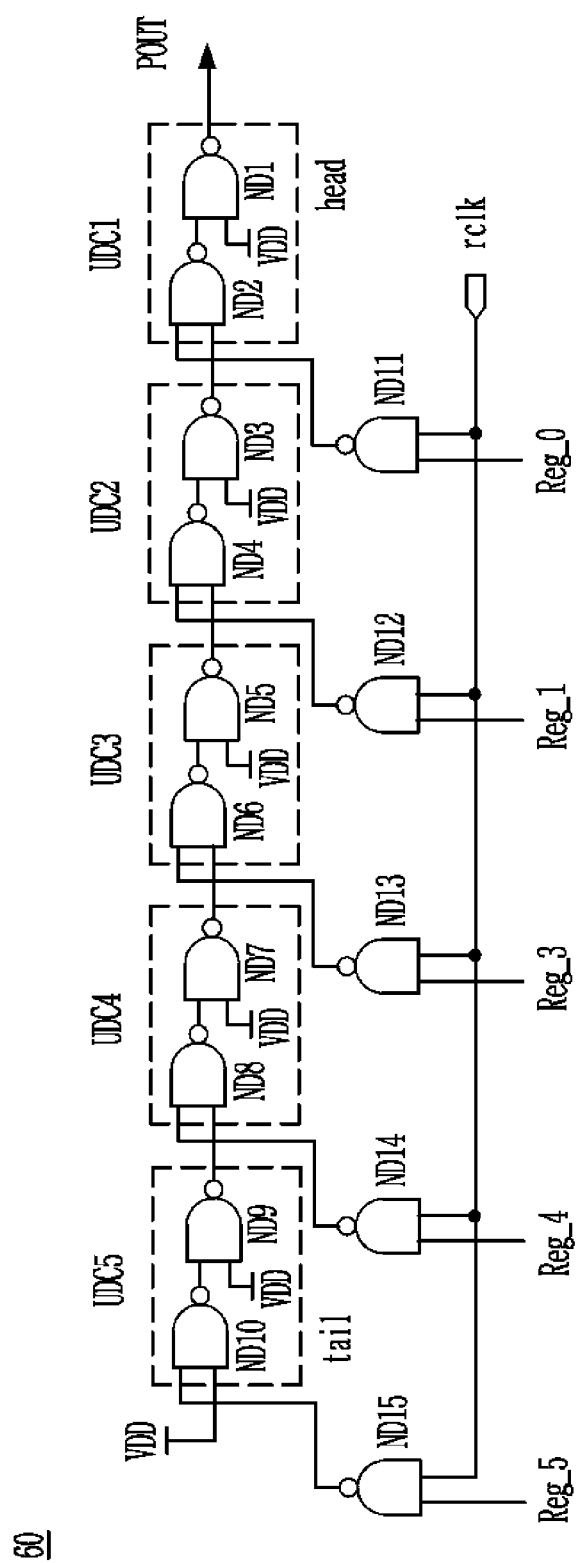
FIG. 2 is a circuit diagram illustrating an example of a delay line related to the embodiment.

FIG. 2 illustrates an embodiment of the above-described delay lines 60 or 61.

As described above, the first and second delay lines 60 and 61 may have substantially the same configuration. Thus, FIG. 2 illustrates only the first delay line 60.

Referring to FIG. 2, the delay line 60 may include a plurality of unit delay cells UDC1 to UDC5 coupled in series and a plurality of NAND gates ND11 to ND15. Signals for controlling the plurality of unit delay cells UDC1 to UDC5 may correspond to register output signals Reg_n (i.e., n being an integer greater than zero) to Reg_0 outputted from the shift registers of the delay controller 50 (refer to FIG. 1), respectively. For example, FIG. 2 illustrates register output signals Reg_0 to Reg_5, but the embodiments are limited in this way and more or less register output signals may be used. The unit delay cells UDC1 to UDC5 may include a plurality of NAND gates ND1 to ND10.

The unit delay cell UDC5 may include the NAND gates ND10 and ND9. The NAND gate ND10 may perform a NAND operation on a supply voltage VDD and an output signal of the NAND gate ND15, and the NAND gate ND9 may perform a NAND operation on the supply voltage VDD and an output signal of the NAND gate ND10 and output the operation result to the unit delay cell UDC4. Since the other unit delay cells UDC4 to UDC1 have the same configuration as the unit delay cell UDC5, the detailed descriptions thereof are omitted herein. Also, for example, the unit delay cell UDC5 at the tail is illustrated in FIG. 2.

The plurality of NAND gates ND11 to ND15 may perform a NAND operation on the rising clock rclk and the register output signals Reg_0 to Reg_5 outputted from the delay controller 50, respectively. Thus, as the rising clock rclk is applied to the unit delay cells in which the register output signals Reg_0 to Reg_5 become a high level, a delay path may be formed.

Figure 3A:
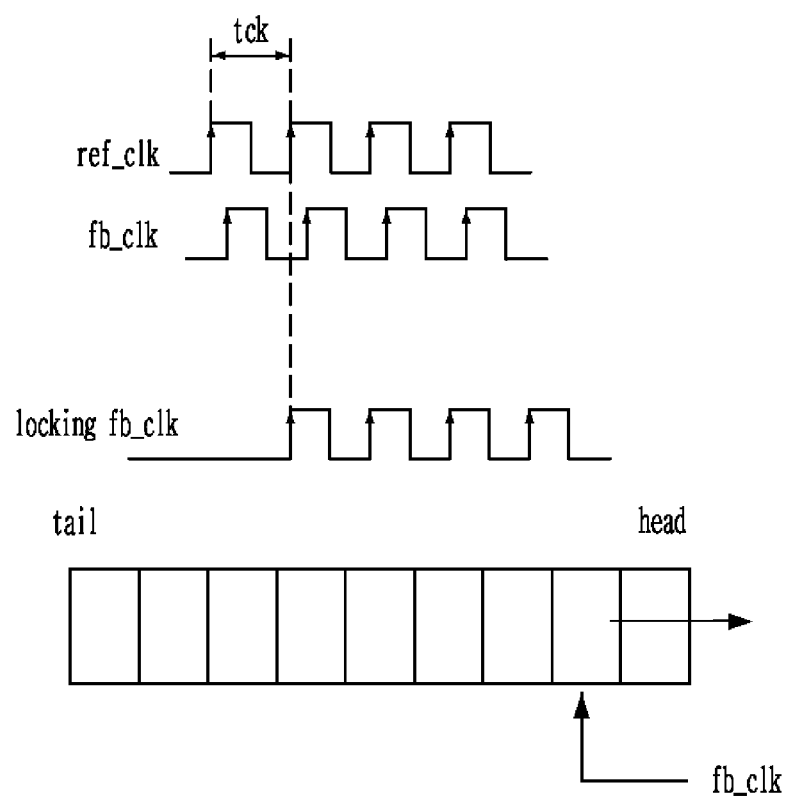
FIGS. 3A and 3B are timing diagrams for comparatively describing a locking operation of a delay-locked loop (DLL) circuit at high and low frequencies.
Figure 3B:
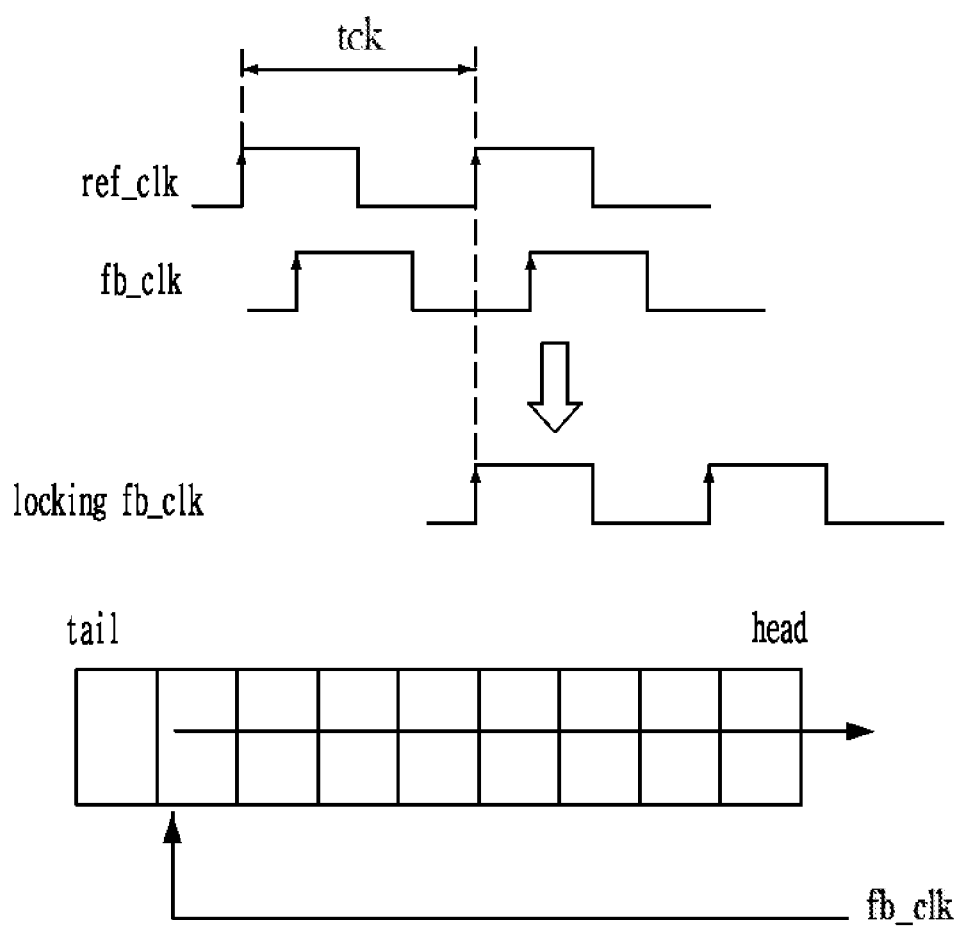

FIGS. 3A and 3B are timing diagrams for comparatively describing the operation of the DLL circuit at high and low frequencies.

FIG. 3A illustrates the case in which the frequencies of the external clocks clk and clkb inputted to the DLL circuit are relatively high, and FIG. 3B illustrates the case in which the frequencies of the external clocks clk and clkb inputted to the DLL circuit are relatively low.

Referring to FIG. 3A, when the frequencies of the external clocks clk and clkb inputted to the DLL circuit are relatively high, the reference clock ref_clk may also have a relatively high frequency (i.e., first frequency). Thus, the reference clock ref_clk may have a relatively short unit cycle tck.

Since a phase difference between the reference clock ref_clk and the feedback clock fb_clk cannot exceed the unit cycle tck of the reference clock ref_clk, a delay amount for delaying the feedback clock fb_clk to synchronize a reference edge of the feedback clock fb_clk with a reference edge of the reference clock ref_clk may not exceed the unit cycle tck of the reference clock ref_clk. The reference edge of the feedback clock fb_clk may indicate a rising edge, but may be set to a falling edge. Thus, when the frequencies of the external clocks clk and clkb are relatively high, the locking operation (i.e., see locking fb_clk in FIG. 3A) may be ended even though the feedback clock fb_clk is slightly delayed, and only a small number of unit delay cells may be used (i.e., as indicated by the arrow adjacent to the head in FIG. 3A).

Referring to FIG. 3B, when the frequencies of the external clocks clk and clkb inputted to the DLL circuit are relatively low, the reference clock ref_clk may have a relatively low frequency (i.e., second frequency). Thus, the reference clock ref_clk may have a relatively long unit cycle tck.

Since a phase difference between the reference clock ref_clk and the feedback clock fb_clk cannot exceed the unit cycle tck of the reference clock ref_clk, a delay amount for delaying the feedback clock fb_clk to synchronize a reference edge of the feedback clock fb_clk with a reference edge of the reference clock ref_clk may not exceed the unit cycle tck of the reference clock ref_clk. Thus, when the frequencies of the clocks clk and clkb inputted from outside are relatively low, the feedback clock fb_clk must be significantly delayed in order to end the locking operation (i.e., see locking fb_clk in FIG. 3B), and a large number of unit delay cells must be used (i.e., as indicated by the arrow adjacent to the tail in FIG. 3B).

Due to a rapid current flow from an external power supply to an internal circuit, noise induced by a power supply line may occur in a delay line. As a method for reducing such noise, a reservoir capacitor may be used. However, since the semiconductor device does not have a sufficient area due to high integration of the semiconductor device, the area for the reservoir capacitor is insufficient. Thus, it is difficult to form a reservoir capacitor having a capacity enough to reduce noise of all unit cells within the delay line.

Since a high-frequency signal has a tighter signal margin than a low-frequency signal, a clean clock may be required. Thus, in order to improve noise reduction efficiency in the delay line using a reservoir capacitor having a limited capacity and formed in a limited area, noise of unit delay cells used for delaying a high-frequency clock needs to be preferentially reduced.

FIG. 4 is a layout diagram of a semiconductor device in accordance with an embodiment.

Referring to FIG. 4, the semiconductor device in accordance with the embodiment may include delay lines 60 and 61. The delay lines 60 and 61 may include a first delay line 60 and a second delay line 61. The first delay line 60 may delay the phase of a rising clock rclk, and the second delay line 61 may delay the phase of a falling clock fclk.

The first delay line 60 may include a plurality of unit delay cells UDC1 to UDC5, and the plurality of unit delay cells UDC1 to UDC5 may be arranged in a line along the longitudinal direction of the first delay line 60, that is, along the direction defined as the x-axis in FIG. 4. The second delay line 61 may be arranged in parallel to the first delay line 60, while having substantially the same configuration as the first delay line 60.

Hereafter, a frequency serving as a reference for distinguishing between a high frequency and a low frequency will be defined as "reference frequency". The reference frequency may be previously set by a designer at a design step. The reference frequency does not have an unchangeable value, but may differ depending on the specification.

Since the delay amount of the delay line at the reference frequency cannot exceed the unit cycle of the reference frequency, the maximum delay amount of the delay line at the reference frequency may be set to the unit cycle of the reference frequency. Thus, when the reference frequency is determined, the number of unit cells required for delaying a clock by the maximum delay amount at the reference frequency, that is, the unit cycle of the reference frequency may be set, and a required number of unit cells from the unit delay cell UDC1 at the head (i.e., see also FIG. 2) of the delay line may be set to unit cells used for delaying the clock by the maximum delay amount at the reference frequency, that is, the unit cycle of the reference frequency. FIG. 4 also illustrates a tail of the delay line at unit delay cell UDC5.

Furthermore, since the delay amount of the delay line at a high frequency equal to or more than the reference frequency cannot exceed the maximum delay amount of the delay line at the reference frequency, that is, the unit cycle of the reference frequency, unit delay cells used for delaying a clock having a high frequency equal to or more than the reference frequency may be included in the unit delay cells used for delaying a clock by the maximum delay amount at the reference frequency.

In FIG. 4, the unit delay cells represented by UDC1 to UDC3 may indicate the unit delay cells used for delaying a clock by the maximum delay amount of the delay line at the reference frequency, that is, the unit cycle of the reference frequency, and the unit delay cells represented by UDC4 and UDC5 may indicate the unit delay cells which are not used for delaying a clock by the unit cycle of the reference frequency.

Hereafter, for convenience of description, it may be defined that the unit delay cells UDC1 to UDC3 used for delaying a clock by the maximum delay amount at the reference frequency, that is, the unit cycle of the reference frequency are included in a first group G1, and the unit delay cells UDC4 and UDC5 which are not used for delaying a clock by the unit cycle of the reference frequency are included in the second group G2.

In the present embodiment, the unit delay cells UDC1 to UDC3 of the first group G1 and the unit delay cells UDC4 and UDC5 of the second group G2 may be arranged with a predetermined space provided therebetween, and the reservoir capacitor RC may be arranged in the space between the unit delay cells UDC1 to UDC3 of the first group G1 and the unit delay cells UDC4 and UDC5 of the second group G2.

The unit delay cells used for delaying a clock having a high frequency equal to or more than the reference frequency may be included in the unit delay cells UDC1 to UDC3 of the first group G1. Thus, when the reservoir capacitor RC is arranged between the unit delay cells UDC1 to UDC3 of the first group G1 and the unit delay cells UDC4 and UDC5 of the second group G2, the reservoir capacitor RC and the unit delay cells used for delaying a high-frequency clock may be arranged close to each other.

The reservoir capacitor RC may include a MOS transistor-type capacitor. The gate G of the MOS transistor-type capacitor may have a line shape which is extended along the direction perpendicular to the longitudinal direction of the delay lines 60 and 61 (the x-axis direction), that is, the direction defined as the y-axis in FIG. 4. In FIG. 4, symbol A represents a source/drain junction.

In the present embodiment, the gate G of the MOS transistor-type capacitor used as the reservoir capacitor RC may have a line shape extended in the direction perpendicular to the longitudinal direction of the delay lines 60 and 61, that is, the y-axis direction. However, the present embodiment is not limited thereto. For example, as illustrated in FIG. 5, the gate G of the MOS transistor-type capacitor may have a line shape extended along the longitudinal direction of the delay lines 60 and 61, that is, the x-axis direction.

The type of the reservoir capacitor RC may be determined by the type of an element provided in the delay lines 60 and 61. For example, when the element provided in the delay lines 60 and 61 is a thin MOS transistor having a dual gate oxide structure, a thin MOS transistor may be formed as the reservoir capacitor RC, and when the element provided in the delay lines 60 and 61 is a thick MOS transistor having a single gate oxide structure, a thick MOS transistor may be formed as the reservoir capacitor RC.

FIGS. 4 and 5 illustrate the case in which the reservoir capacitor RC is arranged between the unit delay cells UDC1 to UDC3 of the first group G1 and the unit delay cells UDC4 and UDC5 of the second group G2. However, the present embodiment is not limited thereto. As illustrated in FIG. 6, the reservoir capacitor RC may be arranged between the unit delay cells of the first group G1, for example, the unit delay cells UDC2 and UDC3. That is, the technical idea of the present embodiment may include all cases in which the reservoir capacitor RC is adjacent to one or more of the unit delay cells UDC1 to UDC3 of the first group G1.

In accordance with the present embodiments, the distance between the reservoir capacitor and the unit delay cells used for delaying a clock having a high frequency equal to or more than the reference frequency can be reduced. Thus, since the reservoir capacitor having a predetermined capacity and formed in a limited area can be used to supply a sufficient amount of voltage to the unit delay cells used for delaying a high-frequency clock within a short time, the level of the voltage supplied to the unit delay cells used for delaying a high-frequency clock can be stabilized, and noise of a high-frequency clock which has a tight signal margin and requires high integrity can be effectively reduced. For example, without increasing the area of the reservoir capacitor, noise of the delay line can be effectively reduced to improve the performance of the element.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
   a plurality of delay lines each comprising a plurality of unit delay cells,
   wherein the plurality of unit delay cells are divided into a first group of unit delay cells and a second group of unit delay cells, wherein the first group of the unit delay cells are used to delay a phase of a clock by a unit cycle of a reference frequency, and the second group of the unit delay cells are not used to delay the phase of the clock by the unit cycle of the reference frequency,
   wherein the reference frequency serves as a reference for distinguishing between a first frequency and a second frequency, and
   wherein the first frequency is a frequency higher than the reference frequency, and the second frequency is a frequency lower than the reference frequency, and
   a reservoir capacitor selectively located adjacent to only one or more of the unit delay cells of the first group, and wherein the one or more of the unit delay cells of the first group delays the clock having the first frequency.

2. The semiconductor device of claim 1, wherein the reservoir capacitor is coupled between the first group of the unit delay cells and the second group of the unit delay cells.

3. The semiconductor device of claim 1, wherein the reservoir capacitor is coupled between the unit delay cells of the first group.

4. The semiconductor device of claim 1, wherein the unit delay cells of the first and second groups are arranged in a first direction along the longitudinal direction of the delay line.

5. The semiconductor device of claim 1, wherein the reservoir capacitor comprises a MOS transistor type capacitor.

6. The semiconductor device of claim 5, wherein the gate of the MOS transistor type capacitor is formed in a line shape extended along a direction substantially perpendicular to a longitudinal direction of the delay line.

7. The semiconductor device of claim 5, wherein the gate of the MOS transistor type capacitor is formed in a line shape extended along a longitudinal direction of the delay line.

8. The semiconductor device of claim 1, wherein the plurality of delay lines comprises:
   a first delay line configured to delay a rising edge clock; and
   a second delay line configured to delay a falling edge clock.

* * * * *